United States Patent
Chen

(10) Patent No.: US 6,204,121 B1
(45) Date of Patent: Mar. 20, 2001

(54) METHOD FOR BOTTOM ELECTRODE OF CAPACITOR

(75) Inventor: Shih-Ching Chen, Nantou Hsien (TW)

(73) Assignee: United Semiconductor Corp., Hsinchu (TW)

( * ) Notice: Subject to any disclaimer, the term of this patent is extended or adjusted under 35 U.S.C. 154(b) by 0 days.

(21) Appl. No.: 09/213,934

(22) Filed: Dec. 17, 1998

(51) Int. Cl.⁷ .............................................. H01L 21/8242
(52) U.S. Cl. ............................................ 438/255; 438/398
(58) Field of Search ................................. 438/255, 253, 438/396, 398, FOR 220, FOR 212; 148/DIG. 14

(56) References Cited

U.S. PATENT DOCUMENTS 5,858,837 * 1/1999 Sakoh et al. .
6,080,633 * 6/2000 Sze et al. .

* cited by examiner

*Primary Examiner*—George Fourson
*Assistant Examiner*—Barbara Elizabeth Abbott
(74) *Attorney, Agent, or Firm*—Jiawei Huang; J C Patents

(57) ABSTRACT

A method of fabricating a bottom electrode of a capacitor, in which a semiconductor substrate is provided wherein a transistor is formed thereon and the transistor contains a source/drain region. A dielectric layer having a contact hole is formed over the substrate wherein a portion of the source/drain region is exposed by the contact hole. A doped polysilicon layer is formed over the substrate. An insulating layer is formed on the doped polysilicon layer. An amorphous silicon layer is formed on the insulating layer. The amorphous silicon layer, the insulating layer and the doped polysilicon layer are defined to form a main structure of the bottom electrode. Amorphous silicon spacers are formed on sidewalls of the main structure. A hemispherical grained silicon layer is formed on the amorphous silicon layer and the amorphous silicon spacers.

13 Claims, 6 Drawing Sheets

METHOD FOR BOTTOM ELECTRODE OF CAPACITOR

CROSS-REFERENCE TO RELATED APPLICATION

This application claims the priority benefit of Taiwan application Ser. No. 87118125, filed Oct. 31, 1998.

BACKGROUND OF THE INVENTION

1. Field of Invention

The present invention relates to fabrication of a semiconductor device. More particularly, the present invention relates to a method of fabricating a bottom electrode of a capacitor.

2. Description of Related Art

A conventional DRAM cell is constructed from a MOS transistor and a capacitor. The capacitor functions as a signal storage device, and therefore plays an important role in the operation of a DRAM cell. If the number of charges stored in a capacitor is high, noise interference when data are read from the capacitor are less and refresh frequency is lower.

In the design of very large scale integrated (VLSI) circuits, one method of increasing a capacitor's capacitance is to increase storage node surface area. This is because capacitance value is proportional to the surface area of the storage node or electrode, which are made from a conductive material. At present, fin types or hemispherical grained structures are used to increase the surface area of storage nodes. However, manufacturing methods for fin-type or hemispherical grained structures are quite complicated, and hence mass production is rather difficult. Therefore, the simpler, stacking method of increasing surface area is still employed. Nevertheless, one common method of increasing surface area and hence charge storage capacity of a capacitor is to form a layer of hemispherical grained (HSG) polysilicon over the lower electrode.

In the conventional method of manufacturing DRAM capacitors, hemispherical grained silicon (HSG) is directly grown over the surface of a polysilicon bottom electrode. The HSG is a layer having a large number of hemispherical grains which increase the surface area of an electrode plate.

In general, the HSG layer is fabricated on a substrate by heating the substrate to a temperature of about 530° C. so that an amorphous silicon layer forms on the substrate surface. This amorphous silicon layer is also know as a—silicon. By heating to the phase transfer temperature of about 560° C. to 590° C., a hemispherical grained silicon layer is grown over the a—silicon. Therefore, the surface area of an electrode plate is increased.

FIG. 1A through FIG. 1E are schematic, cross-sectional views showing a conventional method of fabricating a bottom electrode of a capacitor.

As shown in FIG. 1A, a semiconductor substrate 100 is provided. A transistor is formed on the substrate 100, wherein the transistor contains a metal-oxide semiconductor (MOS) 101 and a source/drain region 102. An insulating layer 103 having a contact hole 104 is formed over the substrate 100. and a portion of the source/drain region 102 is exposed by the contact hole 104.

As shown in FIG. 1B, a doped amorphous silicon layer 106 is formed over the substrate 100 and the contact hole 104 is filled with the doped amorphous layer 106. The doped amorphous silicon is commonly used to increase conductivity. The dopants of the doped amorphous silicon layer 106 are phosphorous ions or arsenic ions. The doped amorphous silicon layer 106 is formed by low-pressure chemical vapor deposition (LPCVD).

As shown in FIG. 1C, the doped amorphous silicon layer 106 on the dielectric layer 103 is defined to leave the amorphous silicon layer 106a directly above the contact hole 104. The amorphous silicon layer 106a directly above the contact hole 104 is the main structure of a bottom electrode of a capacitor.

As shown in FIG. 1D, a seeding process and an annealing process are performed on the substrate 100. Hemispherical grained silicon (HSG) layer 108 grows on the surface of the amorphous silicon layer 106a so that the surface area of the amorphous silicon layer 106a is increased. A bottom electrode is composed of the amorphous silicon layer 106a and the HSG layer 108.

Generally, the operating conditions for forming an amorphous silicon layer by LPCVD are similar to those for forming a polysilicon layer by LPCVD. The greatest difference is their operating temperatures. The operating temperature of the polysilicon layer is higher than the one of the amorphous silicon layer. The operating temperature of the polysilicon layer is from about 600° C. to about 650° C. The operating temperature of the amorphous silicon layer is from about 500° C. to about 550° C. Because of the higher depositing temperature, molecules have higher kinetic energy and are easily mobile on the wafer so that molecules aggregate to easily form crystals. Therefore, formation of amorphous silicon has to be performed at lower temperature. However, when amorphous silicon is formed at a lower temperature, the depositing rate is greatly reduced. For example, depositing rate is about 100 Å/min at 600° C.; depositing rate is reduced to about 25 Å/min at 550° C.; and depositing rate is only about 8 Å/min at 520° C.

About 16 hours are required to deposit the amorphous silicon layer 106 on the substrate 100 by LPCVD at 800K and implanting ions with concentration of about $3 \times 10^{20}/cm^3$. The process is time-consuming; therefore, the process is not suitable for mass production.

Implanting a high concentration of ions in the conventional method cannot lower contact resistance between the contact and the source/drain region 102. More energy is added during implanting high concentration ions. Molecules obtain more energy to easily move on the wafer. Therefore, crystals are easily formed in the amorphous silicon layer 106 so that hemispherical grains form only with difficulty on the surface of the amorphous silicon layer 106.

Additionally, in the conventional method, the amorphous silicon layer 106 is used to adjust the thickness of the bottom electrode. In order to increase the surface area of the bottom electrode, a thicker amorphous silicon layer is deposited. However, depositing a too thick amorphous silicon layer 106 is time consuming and leads to crystal formation at the bottom of the amorphous silicon layer 106. Thus, hemispherical grains are not easily formed. The aforementioned condition is called bald defect.

In the other hand, during the step of etching the amorphous silicon layer to form the main structure of the bottom electrode, the amorphous silicon layer is difficult to etch. Therefore, taper occurs after etching the amorphous silicon layer 106a, as shown in FIG. 1E. If etching conditions are not controlled well, bridging occurs between the two neighboring amorphous silicon layers 106b, leading to malfunction of devices.

SUMMARY OF THE INVENTION

Accordingly, the present invention provides a method of fabricating a bottom electrode of a capacitor. The invention uses hemispherical grained silicon layer to increase surface area of the bottom electrode.

The invention provides a method of fabricating a bottom electrode of a capacitor. The method well controls formation of the bottom electrode so that bridging, leading to malfunction of devices, can be avoided.

To achieve these and other advantages and in accordance with the purpose of the invention, as embodied and broadly described herein, the invention provides a method of fabricating a bottom electrode of a capacitor. A semiconductor substrate is provided wherein a transistor is formed thereon and the transistor contains a source/drain region. A dielectric layer having a contact hole is formed over the substrate wherein a portion of the source/drain region is exposed by the contact hole. A doped polysilicon layer is formed over the substrate. An insulating layer is formed on the doped polysilicon layer. An amorphous silicon layer is formed on the insulating layer. The amorphous silicon layer, the insulating layer and the doped polysilicon layer are defined to form a main structure of the bottom electrode. Amorphous silicon spacers are formed on sidewalls of the main structure. A hemispherical grained silicon layer is formed on the amorphous silicon layer and the amorphous silicon spacers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
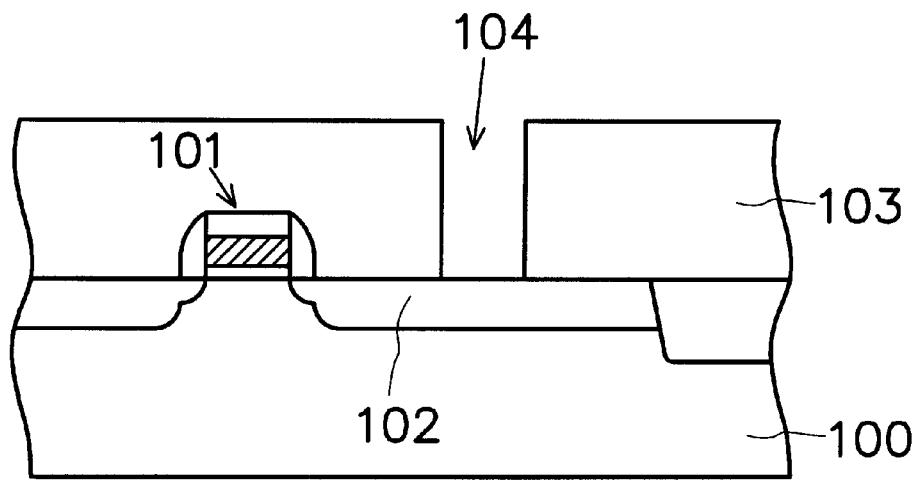
FIG. 1A through FIG. 1E are schematic, cross-sectional views showing a conventional method of fabricating a bottom electrode of a capacitor.
Figure 1B:
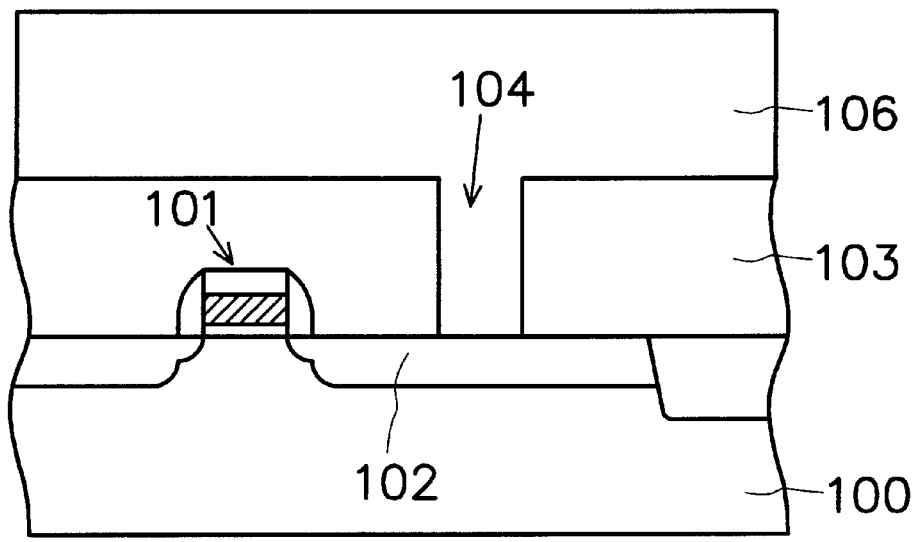
Figure 1C:
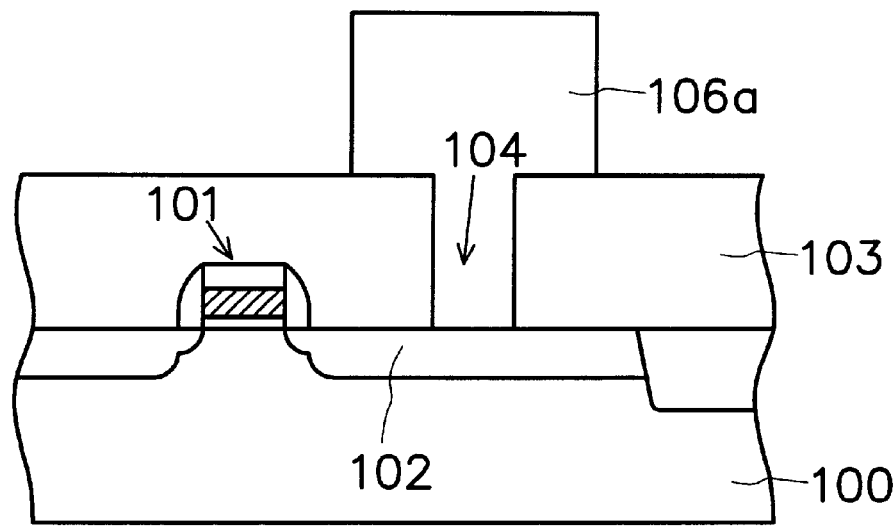
Figure 1D:
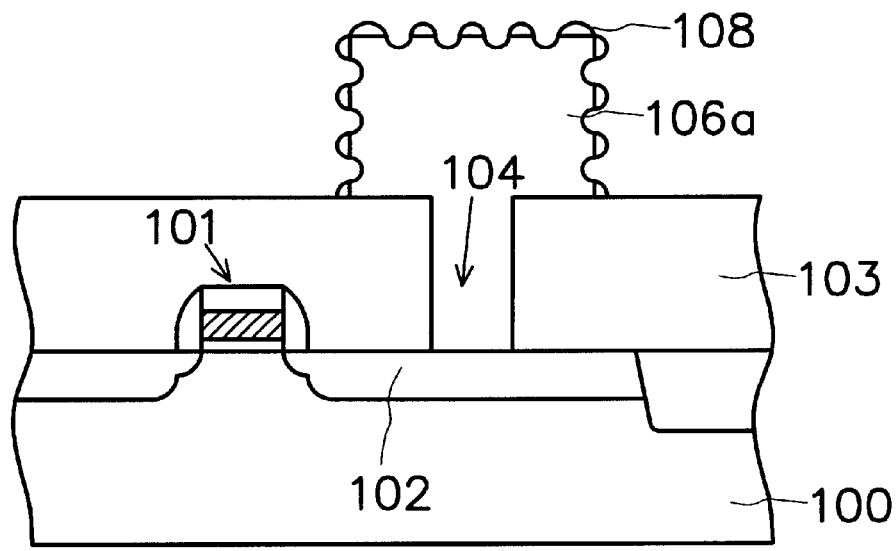
Figure 1E:
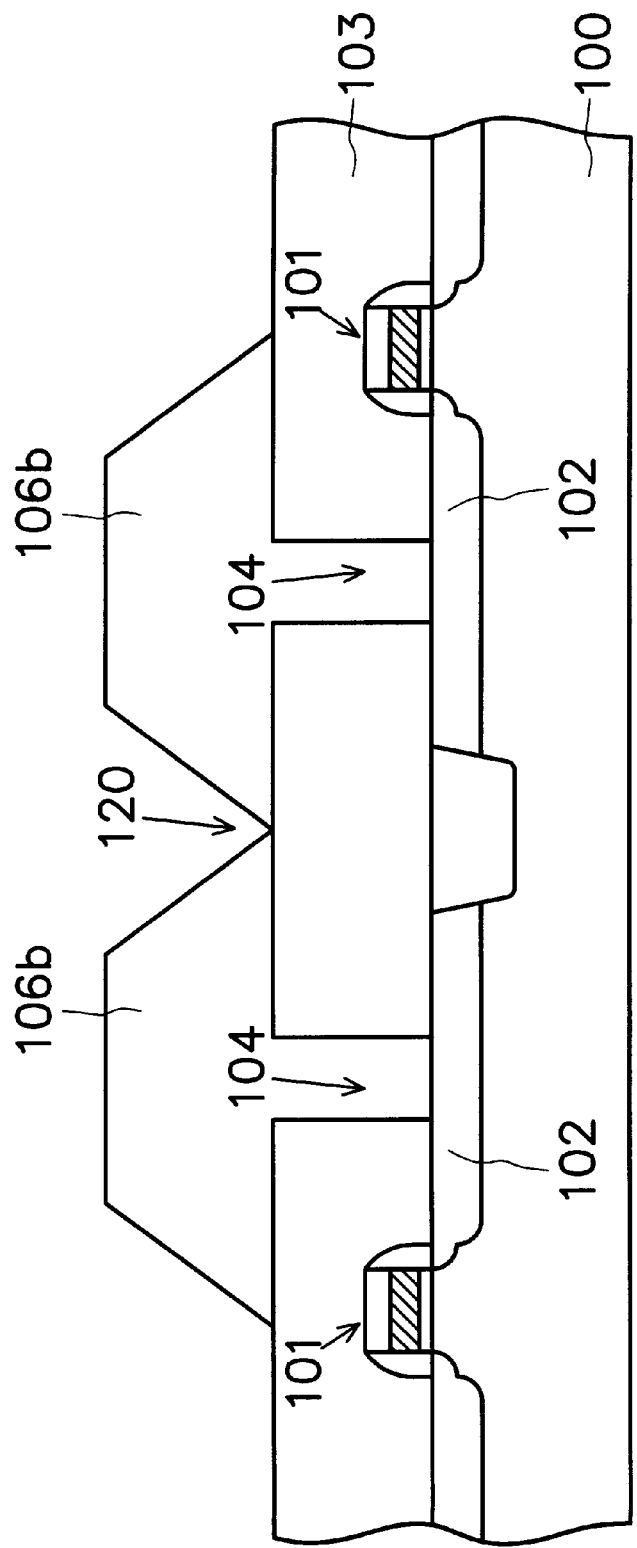

Reference will now be made in detail to the present preferred embodiments of the invention, examples of which are illustrated in the accompanying drawings. Wherever possible, the same reference numbers are used in the drawings and the description to refer to the same or like parts.

FIG. 2A through FIG. 2F are schematic, cross-sectional views showing a method of fabricating a bottom electrode of a capacitor according to the preferred embodiment of this invention.

Figure 2A:
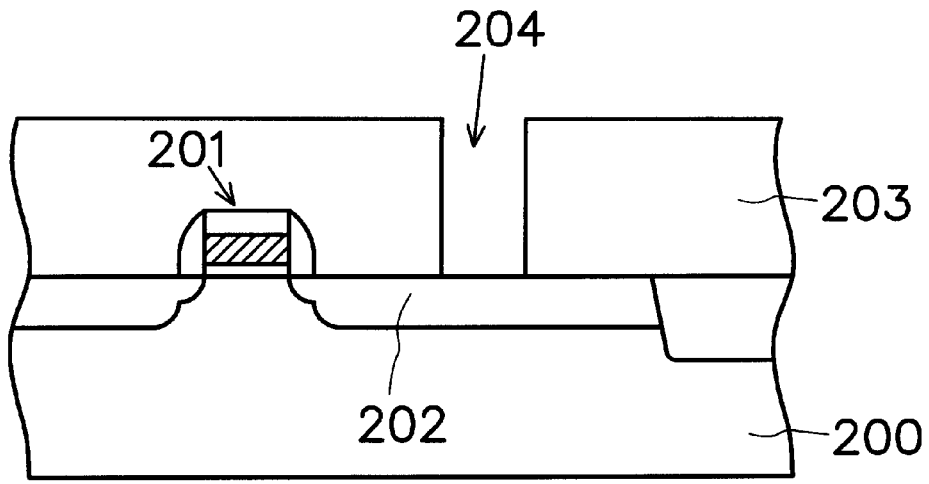
FIG. 2A through FIG. 2F are schematic, cross-sectional views showing a method of fabricating a bottom electrode of a capacitor according to one preferred embodiment of this invention.

As shown in FIG. 2A, a semiconductor substrate 200 is provided. A transistor is formed on the substrate 200, wherein the transistor contains a metal-oxide semiconductor (MOS) 201 and a source/drain region 202. An insulating layer 203 having a contact hole 204 is formed over the substrate 200, and a portion of the source/drain region 202 is exposed by the contact hole 204.

Figure 2B:
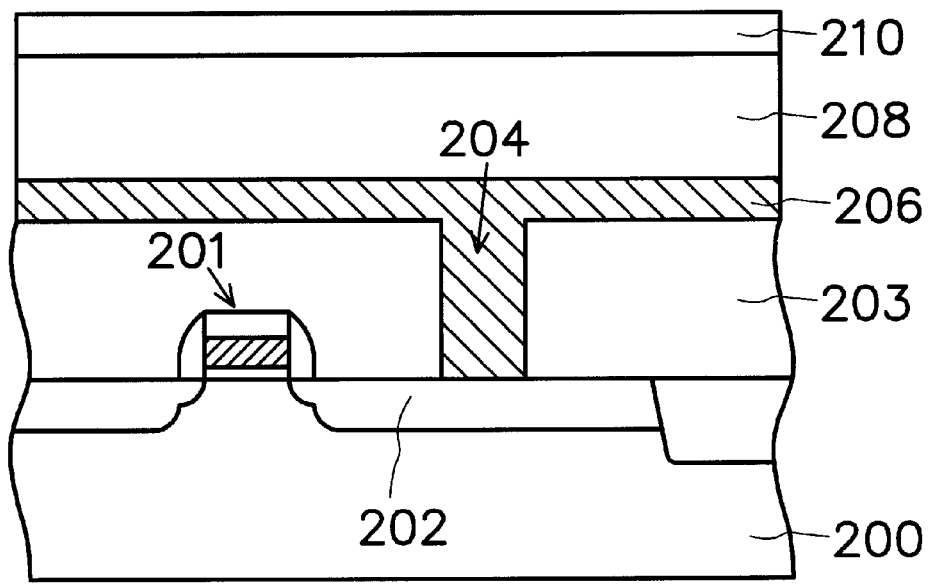

As shown in FIG. 2B, a doped polysilicon layer 206 is formed over the dielectric layer 203 to fill the contact hole 204 so as to electrically couple the source/drain region 202. The doped polysilicon layer 206 is formed by low-pressure chemical vapor deposition (LPCVD), for example. The doped ions are, for example, phosphorous ions with a concentration of from about $1 \times 10^{20}/cm^3$ to about $5 \times 10^{20}/cm^3$. The duration is from about 40 minutes to 4 hours. The polysilicon layer 206 is about 1000 Å thick. In contrast with the conventional method, the contact hole 204 of the invention is filled with the doped polysilicon layer 206. Therefore, contact resistance generated between the contact and the source/drain region is reduced. The refresh frequency is thus lowered.

Still referring to FIG. 2B, an insulating layer 208, such as a silicon oxide layer, is formed on the doped polysilicon layer 206. The formation of the insulating layer 208 is by plasma-enhanced chemical vapor deposition (PECVD), for example. The insulating layer 208 is about 8000 Å thick. The advantage of using the insulating layer 208 is that the depositing rate is more rapid than the depositing rate of polysilicon or amorphous silicon. In general, depositing the insulating layer 208 only takes about several minutes at 800 K. A doped amorphous silicon layer 210 is formed on the insulating layer 208, for example, by LPCVD. The dopant concentration is from about $1 \times 10^{20}/cm^3$ to about $5 \times 10^{20}/cm^3$. The insulating layer 208 is about 1000 Å thick.

Figure 2C:
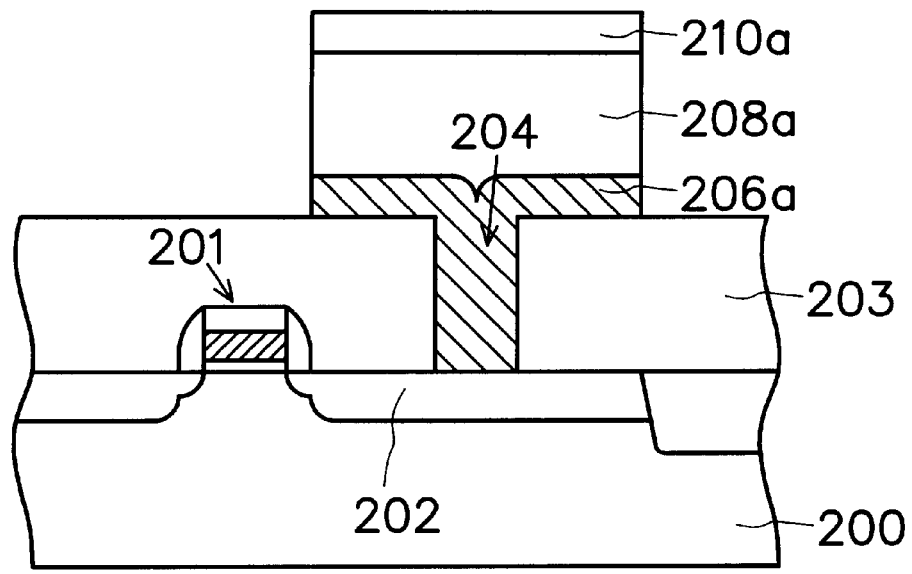

As shown in FIG. 2C, the amorphous silicon layer 210, the insulating layer 208 and the doped polysilicon layer 206 are defined to form a three-layer structure composed of the amorphous silicon layer 210a, the insulating layer 208a and the doped polysilicon layer 206a, for example, by photolithography and etching.

This invention uses the insulating layer 208 with a rapid depositing rate to control the thickness of the bottom electrode. The insulating layer 208 is easily etched and its etching condition is easily controlled. Therefore, tapering and bridging can be avoided in the invention.

Figure 2D:
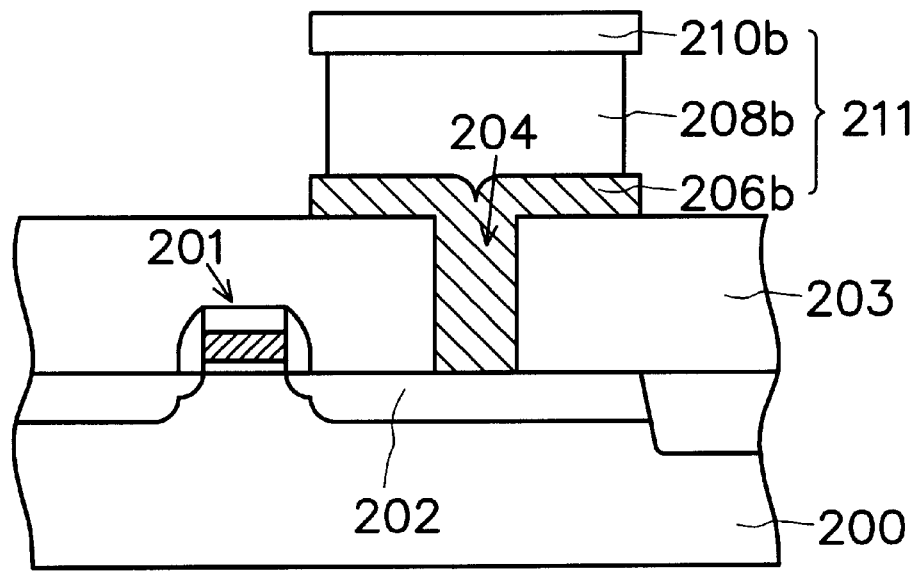

As shown in FIG. 2D, after the definition step, the three-layer structure is exposed to the air so as to form a native oxide layer on the surface of the three-layer structure. Hence a treatment is performed. The wafer is commonly dipped into a hydrogen fluoride (HF) solution in order to remove the native oxide layer. However, the treatment damages the amorphous silicon layer 210a, the insulating layer 208a and the polysilicon layer 206a so that they form the amorphous silicon layer 210b, the insulating layer 208b and the polysilicon layer 206b. A main structure 211 of a bottom electrode is composed of the amorphous silicon layer 210b, the insulating layer 208b and the polysilicon layer 206b.

Figure 2E:
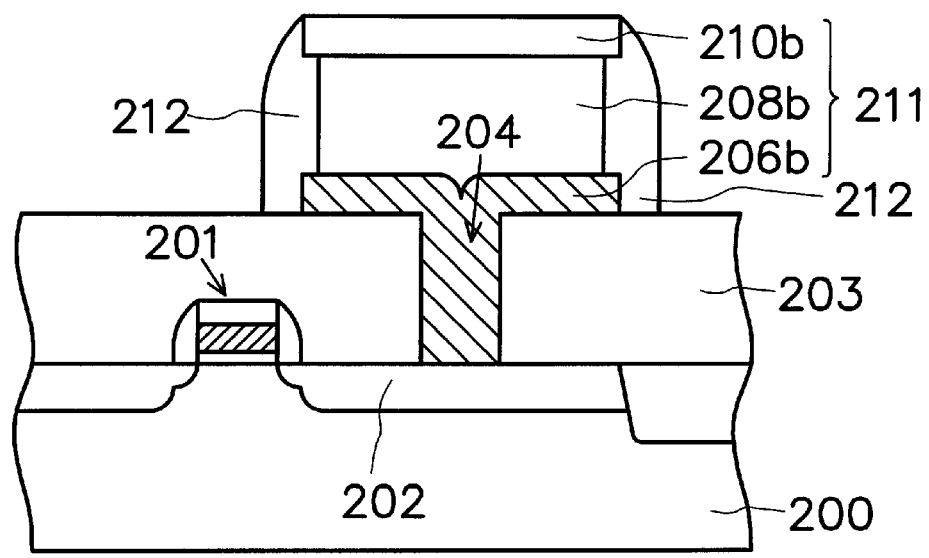

As shown in FIG. 2E, spacers 212 are formed on sidewalls of the main structure 211. The spacers 212 include, for example, amorphous silicon. The formation of the spacers 212 includes forming a conformal doped amorphous silicon layer by LPCVD, for example. The conformal doped amorphous silicon layer is etched back, for example, by anisotropic dry etching. Consequently, the sidewalls of the main structure 211 are covered with the amorphous silicon.

Figure 2F:
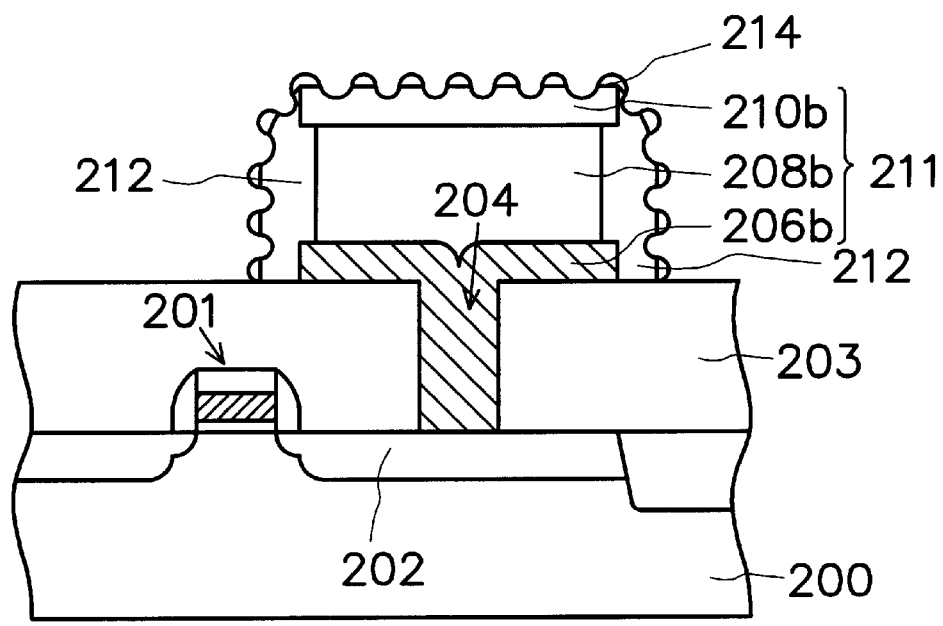

As shown in FIG. 2F, a seeding process and an annealing process are performed on the substrate 200. Hemispherical grained silicon (HSG) layer 214 grows on the surface of the amorphous silicon layer 210b and the amorphous silicon spacers 212, for example, by a selective growth method. A complete bottom electrode is formed. The HSG layer 214 is used to increase the surface area of the bottom electrode.

The pattern of the bottom electrode in the aforementioned embodiment is just an example. In fact, the invention can be used with any pattern for a bottom electrode.

In summary, features of the invention include:

1. The invention fills the contact hole with the doped polysilicon layer. Thus, contact resistance between the contact and the source/drain region is much lower than the contact resistance in the conventional method of using amorphous silicon. Therefore, refresh frequency of a capacitor composed of the bottom electrode is reduced due to the lower contact resistance. The invention can further increase the doped concentration of ions in order to decrease the contact resistance.

2. The invention uses the insulating layer composed of silicon oxide to adjust the thickness of the bottom electrode. Since the insulating layer is easily etched, the etching condition of the insulating layer is easily controlled. Thus, bridging usually occurring in the conventional method can be avoided.

3. In the conventional method, the amorphous silicon layer is formed over the substrate by LPCVD to control the thickness of the bottom electrode. This process takes about 16 hours at 800K. which is too long. The invention uses the insulating layer composed of silicon oxide to form the main structure of the bottom electrode. The depositing rate of the insulating layer is more rapid than the depositing rate of the polysilicon layer or the amorphous silicon layer. Depositing the insulating layer only takes several minutes. Hence throughput is greatly increased.

It will be apparent to those skilled in the art that various modifications and variations can be made to the stricture of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bottom electrode of a capacitor, comprising:

providing a substrate wherein a transistor is formed thereon and the transistor contains a source/drain region;

forming a dielectric layer having a contact hole over the substrate wherein a portion of the source/drain region is exposed by the contact hole;

forming a doped polysilicon layer over the substrate to fill the contact hole;

forming an insulating layer on the doped polysilicon layer;

forming an amorphous silicon layer on the insulating layer;

defining the amorphous silicon layer, the insulating layer and the doped polysilicon layer to form a main structure of the bottom electrode directly above the contact hole;

forming amorphous silicon spacers on sidewalls of the main structure; and forming a hemispherical grained silicon layer on the amorphous silicon layer and the amorphous silicon spacers.

2. The method according to claim 1, wherein the step of forming the doped polysilicon layer comprises low-pressure chemical vapor deposition.

3. The method according to claim 1, wherein dopants of the doped polysilicon layer comprise phosphorous ions.

4. The method according to claim 3, wherein the concentration of the phosphorous ions is from about $1\times10^{20}/cm^3$ to about $5\times10^{20}/cm^3$.

5. The method according to claim 1, wherein the polysilicon layer is about 1000 Å thick.

6. The method according to claim 1, wherein the step of forming the insulating layer comprises plasma-enhanced chemical vapor deposition.

7. The method according to claim 1, wherein the insulating layer comprises an oxide.

8. The method according to claim 1, wherein the step of forming the amorphous silicon spacers comprises low-pressure chemical vapor deposition.

9. The method according to claim 1, wherein the amorphous silicon spacers comprise amorphous silicon doped with phosphorous ions.

10. The method according to claim 1, wherein the step of forming the amorphous silicon layer comprises low-pressure chemical vapor deposition.

11. The method according to claim 1, wherein the amorphous silicon layer comprises doped amorphous silicon.

12. The method according to claim 11, wherein dopants of the amorphous silicon are phosphorous ions.

13. The method according to claim 11, wherein the concentration of the phosphorous ions is from about $1\times10^{20}/cm^3$ to about $5\times10^{20}/cm^3$.

* * * * *